United States Patent
Chang

(10) Patent No.: US 11,429,138 B2
(45) Date of Patent: Aug. 30, 2022

(54) CLOCK SIGNAL GENERATING CIRCUIT

(71) Applicant: SK hynix Inc., Icheon (KR)

(72) Inventor: Keun Jin Chang, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/333,889

(22) Filed: May 28, 2021

(65) Prior Publication Data

US 2022/0163994 A1    May 26, 2022

(30) Foreign Application Priority Data

Nov. 25, 2020  (KR) .................. 10-2020-0160208

(51) Int. Cl.
*G06F 1/12* (2006.01)
*H03L 7/097* (2006.01)
*G06F 1/08* (2006.01)

(52) U.S. Cl.
CPC .................. *G06F 1/12* (2013.01); *G06F 1/08* (2013.01); *H03L 7/097* (2013.01)

(58) Field of Classification Search
CPC ..... G06F 1/04; G06F 1/06; G06F 1/08; G06F 1/12; G06F 1/14; H03L 7/097
See application file for complete search history.

(56) References Cited

U.S. PATENT DOCUMENTS 7,061,337 B2    6/2006  Partovi et al.
7,266,172 B2 *  9/2007  Hairapetian ............ H03L 7/089
                                             327/148

FOREIGN PATENT DOCUMENTS

KR        101070366 B1      10/2011
KR        101083877 B1      11/2011

* cited by examiner

*Primary Examiner* — Diana J. Cheng

(57) ABSTRACT

A clock signal generating circuit includes a detecting circuit configured to generate a first voltage based on first and second clock signals and adjust a level of the first voltage in response to first and second setup voltages and a resistance variable code, a comparing circuit configured to compare the first voltage and a reference voltage and output a check signal according to a comparison result, a code generating circuit configured to perform a first modulation operation for determining the resistance variable code in response to the check signal and perform a second modulation operation for determining a control code in response to the check signal, and an oscillator configured to adjust an amplitude of the first and second clock signals in response to the control code, and output the first and second clock signals having the adjusted amplitude.

27 Claims, 7 Drawing Sheets

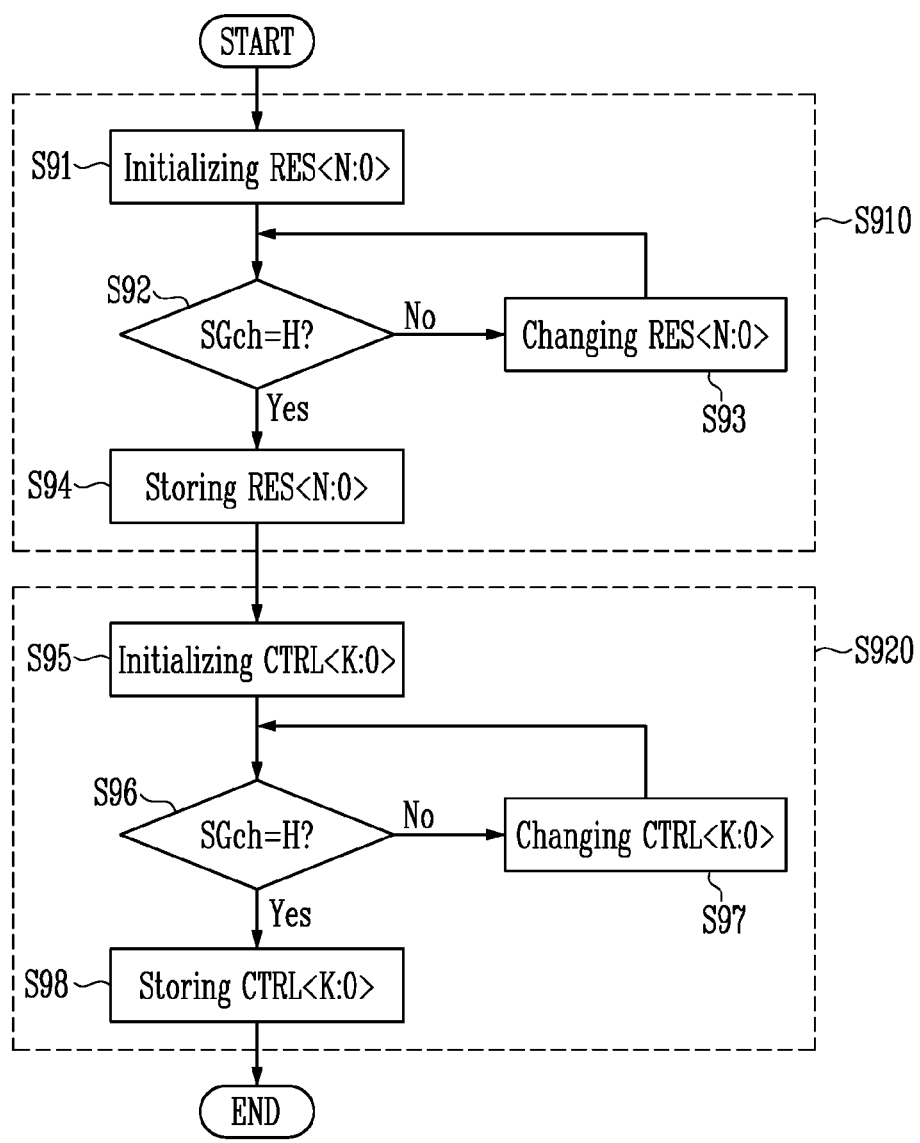

CLOCK SIGNAL GENERATING CIRCUIT

CROSS-REFERENCE TO RELATED APPLICATION

The present application claims priority under 35 U.S.C. § 119(a) to Korean patent application number 10-2020-0160208, filed on Nov. 25, 2020, in the Korean Intellectual Property Office, the entire disclosure of which is incorporated herein by reference.

BACKGROUND

1. Field of Invention

The present disclosure relates to a clock signal generating circuit, and more particularly, to a clock signal generating circuit including an oscillator.

2. Description of Related Art

In a semiconductor memory device, an IC chip, a microcontroller, and a pump circuit, a clock signal is used to operate internal circuits. An oscillator is used to generate the clock signal in the internal circuits.

A period and an amplitude of the clock signal output from the oscillator may be changed according to various factors. For example, the period and the amplitude may be changed as a temperature and a level of a voltage supplied to the oscillator change.

When increasing the amplitude of the clock signal, a signal to noise ratio (SNR), which represents a ratio of a signal to noise, may increase, and thus performance of the oscillator may be improved. However, when increasing the amplitude of the clock signal too much, transistors configuring the oscillator may be damaged.

SUMMARY

An embodiment of the present disclosure provides a clock signal generating circuit capable of limiting or adjusting an amplitude of a clock signal output from an oscillator.

A clock signal generating circuit according to an embodiment of the present disclosure includes a detecting circuit configured to generate a first voltage based on first and second clock signals and adjust a level of the first voltage in response to first and second setup voltages and a resistance variable code, a comparing circuit configured to compare the first voltage and a reference voltage and output a check signal according to a comparison result, a code generating circuit configured to perform a first modulation operation for determining the resistance variable code in response to the check signal and perform a second modulation operation for determining a control code in response to the check signal, and an oscillator configured to adjust an amplitude of the first and second clock signals in response to the control code, and output the first and second clock signals having the adjusted amplitude.

A clock signal generating circuit according to an embodiment of the present disclosure includes an oscillator configured to output first and second clock signals, and a modulation circuit configured to receive first and second setup voltages and the first and second clock signals, and generate a control code adjusted according to the first and second setup voltages and the first and second clock signals, wherein the oscillator is configured to adjust an amplitude of the first and second clock signals according to the control code.

The present technology may prevent damage of transistors configuring an oscillator by limiting or adjusting an amplitude of a clock signal output from the oscillator.

BRIEF DESCRIPTION OF THE DRAWINGS

FIG. 9 illustrates an amplitude modulation operation according to an embodiment of the present disclosure.

DETAILED DESCRIPTION

Figure 1:
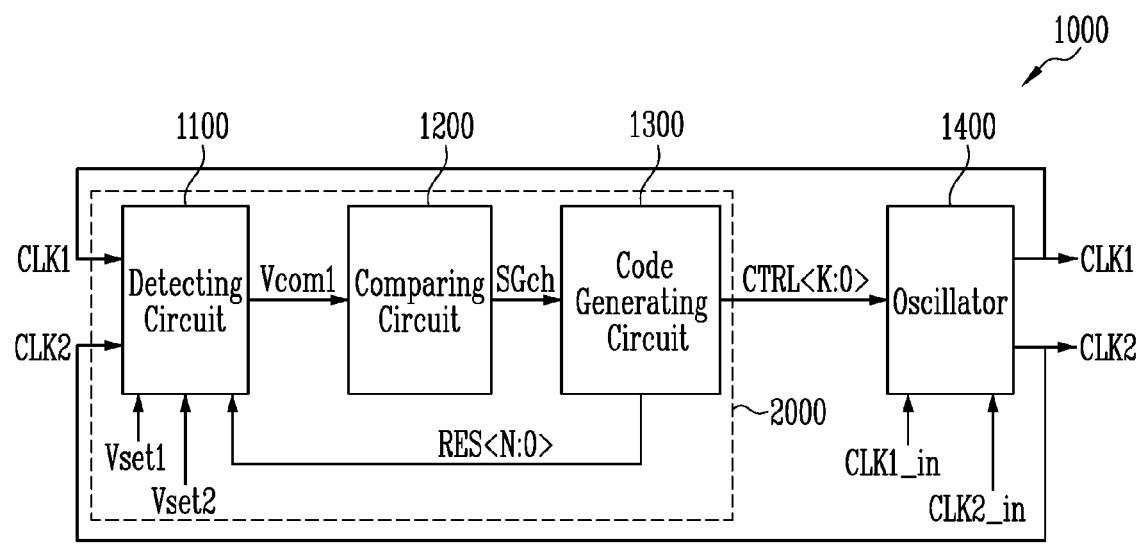
FIG. 1 illustrates a clock signal generating circuit according to an embodiment of the present disclosure.

FIG. 1 illustrates a clock signal generating circuit 1000 according to an embodiment of the present disclosure.

Referring to FIG. 1, the clock signal generating circuit 1000 may be configured to output first and second clock signals CLK1 and CLK2 having different phases. The clock signal generating circuit 1000 may include an oscillator 1400 configured to generate the first and second clock signals CLK1 and CLK2, and an modulation circuit 2000 configured to modulate an amplitude of the first and second clock signals CLK1 and CLK2 output from the oscillator 1400.

The modulation circuit 2000 may include a detecting circuit 1100, a comparing circuit 1200, and a code generating circuit 1300.

The detecting circuit 1100 may output a first voltage Vcom1 based on a resistance variable code RES<N:0> (N is a positive integer) and the first and second clock signals CLK1 and CLK2 output from the oscillator 1400. More specifically, the detecting circuit 1100 may receive first and second setup voltages Vset1 and Vset2 that are arbitrarily determined, form a current path therein in response to the first and second clock signals CLK1 and CLK2, and output the first voltage Vcom1. The first voltage Vcom1 is generated according to the current path and a variable resistance value of the detecting circuit 1100. The variable resistance value changes according to the resistance variable code RES<N:0>.

The first and second setup voltages Vset1 and Vset2 may be determined to have a level for limiting a maximum amplitude of the first and second clock signals CLK1 and CLK2. For example, the first and second setup voltages Vset1 and Vset2 may be set to a positive voltage lower than a power voltage VDD. The resistance variable code RES<N:0> may be varied during an amplitude modulation operation performed by the modulation circuit 2000.

The comparing circuit 1200 may output a check signal SGch by comparing the first voltage Vcom1 with a reference voltage. For example, when the first voltage Vcom1 is lower than the reference voltage, the comparing circuit 1200 may output the check signal SGch having a low level. On the other hand, when the first voltage Vcom1 is equal to or higher than the reference voltage, the comparing circuit 1200 may output the check signal SGch having a high level. A level of the reference voltage may be set so that the amplitude of the first and second clock signals CLK1 and CLK2 does not exceed a predetermined level.

The code generating circuit 1300 may change the resistance variable code RES<N:0> and a control code CTRL<K:0> (K is a positive integer) in response to the check signal SGch and output the changed resistance variable code RES<N:0> and the changed control code CTRL<K:0>. For example, the amplitude modulation operation performed by the modulation circuit 2000 may include a first modulation operation and a second modulation operation. During the first modulation operation, the code generating circuit 1300 may set the resistance variable code RES<N:0> in response to the check signal SGch. During the second modulation operation, the code generating circuit 1300 may set the control code CTRL<K:0> in response to the check signal SGch. The first and second modulation operations may not be performed simultaneously but may be sequentially performed. For example, the second modulation operation may be performed after the first modulation operation is completed, or the first modulation operation may be performed after the second modulation operation is completed.

In the present embodiment, the second modulation operation is performed after the first modulation operation is completed. The code generating circuit 1300 may store the resistance variable code RES<N:0> and the control code CTRL<K:0> that are finally determined.

The oscillator 1400 may output the first and second clock signals CLK1 and CLK2 based on first and second clock input signals CLK1_in and CLK2_in, and adjust the amplitude of the first and second clock signals CLK1 and CLK2 in response to the control code CTRL<K:0>. The first clock input signal CLK1_in and the first clock signal CLK1 may have the same phase, and the second clock input signal CLK2_in and the second clock signal CLK2 may have the same phase. The first clock input signal CLK1_in and the second clock input signal CLK2_in may have opposite phases. Therefore, the first clock signal CLK1 and the second clock signal CLK2 may have opposite phases.

Figure 2:
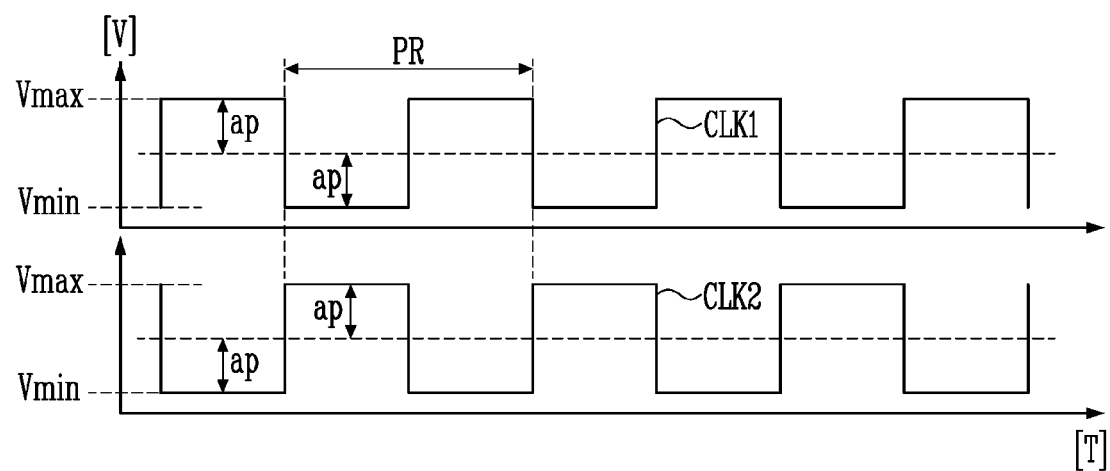
FIG. 2 illustrates first and second clock signals output from an oscillator.

FIG. 2 illustrates the first and second clock signals CLK1 and CLK2 output from the oscillator 1400 of FIG. 1.

Referring to FIG. 2, the first and second clock signals CLK1 and CLK2 output from the oscillator 1400 have opposite phases. For example, the first clock signal CLK1 and the second clock signal CLK2 may have the same period PR and the same amplitude ap, but have opposite phases.

As the amplitude ap of the first and second clock signals CLK1 and CLk2 increases, a signal to noise ratio (SNR) may increase. Here, the SNR may be expressed as S/N. Since the SNR indicates a strength of a signal power to a noise power, the increase of the SNR means that the strength of the signal power increases. Therefore, as the SNR of the first and second clock signals CLK1 and CLK2 increases, the signal strength increases compared to the noise, and thus reliability of the oscillator 1400 may increase.

However, since the oscillator 1400 includes a plurality of transistors configured to output the first and second clock signals CLK1 and CLK2, when increasing the amplitude ap of the first and second clock signals CLK1 and CLK2 too much, a breakdown phenomenon may occur in the transistors. The breakdown phenomenon is a phenomenon in which an insulating material configuring the transistor is damaged and thus a voltage suddenly increases. When the amplitude ap of the first and second clock signals CLK1 and CLK2 increases, a voltage difference between a maximum voltage Vmax and a minimum voltage Vmin of the first and second clock signals CLK1 and CLk2 increases. Therefore, when the voltage difference exceeds a threshold value of the breakdown of the transistors, the breakdown phenomenon may occur in the transistors. Accordingly, in the present embodiment, the clock signal generating circuit 1000 of FIG. 1 may be provided to increase the SNR within a range in which the breakdown phenomenon does not occur in the transistors configuring the oscillator 1400.

Each of the circuits configuring the clock signal generating circuit 1000 is specifically described as follows.

Figure 3:
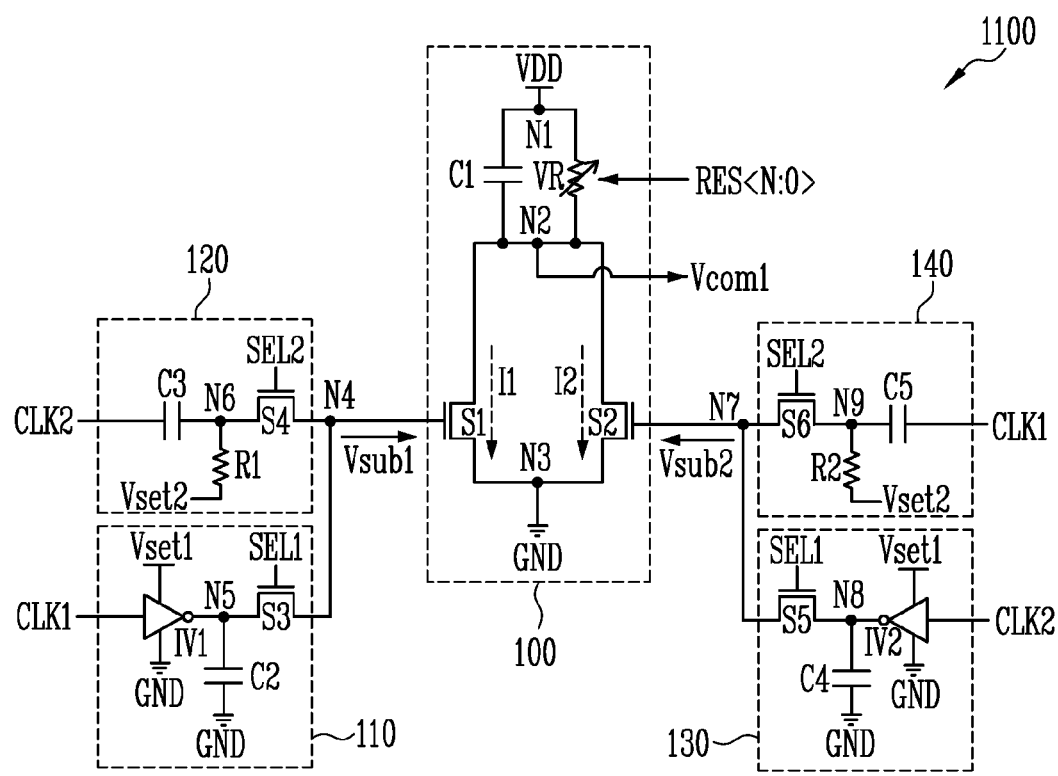
FIG. 3 illustrates a detecting circuit according to an embodiment of the present disclosure.
Figure 4:
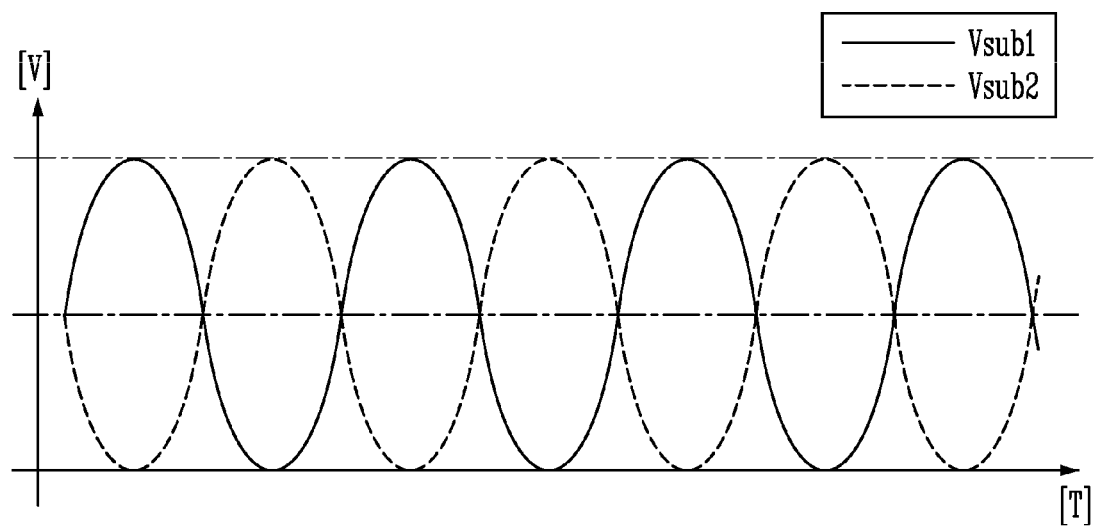
FIG. 4 illustrates first and second sub voltages.

FIG. 3 illustrates the detecting circuit 1100 of FIG. 1 according to an embodiment of the present disclosure, and FIG. 4 illustrates first and second sub voltages.

Referring to FIGS. 3 and 4, the detecting circuit 1100 may receive the first and second setup voltages Vset1 and Vset2, form the current path in the detecting circuit 1100 in response to the first and second clock signals CLK1 and CLK2 output from the oscillator 1400, and output the first voltage Vcom1 generated according to the current path and the variable resistance value changing according to the resistance variable code RES<N:0>. The detecting circuit 1100 may include a voltage output circuit 100, a first resistance modulation circuit 110, a first current modulation circuit 120, a second resistance modulation circuit 130, and a second current modulation circuit 140.

The voltage output circuit 100 may include a first capacitor C1 and a variable resistor VR connected in parallel between a first node N1 and a second node N2, and first and second switches S1 and S2 connected in parallel between the second node N2 and a third node N3. A power voltage VDD may be supplied to the first node N1, and the third node N3 may be connected to a ground terminal GND. The variable resistor VR may change its resistance value according to the resistance variable code RES<N:0>. For example, the resistance variable code RES<N:0> may include 0 or 1 data, or a combination of 0 and 1 data. The variable resistor VR may be configured so that the resistance value thereof increases as the number of 1 data included in the resistance variable code RES<N:0> increases, and the resistance value decreases as the number of 1 data included in the resistance variable code RES<N:0> decreases.

The first switch S1 may be implemented with an NMOS transistor capable of forming a first current path I1 in response to a first sub voltage Vsub1. The second switch S2 may be implemented with an NMOS transistor capable of forming a second current path I2 in response to a second sub voltage Vsub2. A voltage of the second node N2, which is generated according to a turn-on level of the first or second switch S1 or S2 and the resistance value of the variable resistor VR, may be output as the first voltage Vcom1. That is, a level of the first voltage Vcom1 may vary according to the first and second sub voltages Vsub1 and Vsub2 and the resistance value of the variable resistor VR that is determined by the resistance variable code RES<N:0>.

The first and second resistance modulation circuits 110 and 130 may be activated during the first modulation operation to generate the first and second sub voltages Vsub1 and Vsub2, and the first and second current modulation circuits 120 and 140 may be activated during the second modulation operation to generate the first and second sub voltages Vsub1 and Vsub2. Levels of the first and second sub voltages Vsub1 and Vsub2 may have a sine waveform in which phases of the first and second sub voltages Vsub1 and Vsub2 are opposite to each other as shown in FIG. 4.

The first resistance modulation circuit 110 and the first current modulation circuit 120 may generate the first sub voltage Vsub1, and the second resistance modulation circuit 130 and the second current modulation circuit 140 may generate the second sub voltage Vsub2. The first and second resistance modulation circuits 110 and 130 may be activated in response to a first selection signal SEL1, and the first and second current modulation circuits 120 and 140 may be activated in response to a second selection signal SEL2. That is, in the first modulation operation, the first selection signal SEL1 is enabled to activate the first and second resistance modulation circuits 110 and 130. In the second modulation operation, the second selection signal SEL2 is enabled to activate the first and second current modulation circuits 120 and 140. Each of the first and second resistance modulation circuits 110 and 130 and the first and second current modulation circuits 120 and 140 is specifically described as follows.

The first resistance modulation circuit 110 may be connected to the voltage output circuit 100 through a fourth node N4. The first resistance modulation circuit 110 may include a first inverter IV1, a second capacitor C2, and a third switch S3. The first inverter IV1 may receive the first setup voltage Vset1 as a voltage source and may output an inverted clock signal of the first clock signal CLK1 to a fifth node N5. The first setup voltage Vset1 may be a positive voltage arbitrarily set to limit the maximum level of the first voltage Vcom1 output from the voltage output circuit 100.

The second capacitor C2 may be connected between the fifth node N5 and the ground terminal GND, and may make a voltage output from the first inverter IV1 into a sine waveform. The third switch S3 may be connected between the fifth node N5 and the fourth node N4, and may be implemented with an NMOS transistor that is turned on or turned off in response to the first selection signal SEL1. When the first selection signal SEL1 has a high level, the third switch S3 is turned on, so that the fifth node N5 and the fourth node N4 are electrically connected to each other. Therefore, the first resistance modulation circuit 110 may be activated when the first selection signal SEL1 has the high level and deactivated when the first selection signal SEL1 has a low level. When the first clock signal CLK1 is input to the first resistance modulation circuit 110 while the third switch S3 is turned on, the first sub voltage Vsub1 having the sine waveform may be applied to the fourth node N4.

The first current modulation circuit 120 may be connected to the voltage output circuit 100 through the fourth node N4. The first current modulation circuit 120 may include a third capacitor C3, a first resistor R1, and a fourth switch S4. The third capacitor C3 may be connected between a terminal to which the second clock signal CLK2 is input and a sixth node N6, and may charge the second clock signal CLK2 to output a voltage having a sine waveform to the sixth node N6.

The first resistor R1 may be connected between a terminal to which the second setup voltage Vset2 is applied and the sixth node N6. The second setup voltage Vset2 may be a positive voltage arbitrarily set to maintain a minimum level of the voltage applied to the sixth node N6. For example, the second setup voltage Vset2 may be set to have a ½ level of the power voltage VDD. The first resistor R1 may be used to remove noise from the voltage of the sixth node N6. The fourth switch S4 may be connected between the sixth node N6 and the fourth node N4, and may be implemented with an NMOS transistor that is turned on or turned off in response to the second selection signal SEL2. The second selection signal SEL2 may be an inverted signal of the first selection signal SEL1. Therefore, when the second selection signal SEL2 has a high level, the first current modulation circuit 120 may be activated and the first resistance modulation circuit 110 may be deactivated. When the fourth switch S4 is turned on, the voltage having the sine waveform of the sixth node N6 may be transmitted to the fourth node N4, and the voltage transmitted to the fourth node N4 may become the first sub voltage Vsub1.

The second resistance modulation circuit 130 may be connected to the voltage output circuit 100 through a seventh node N7. The second resistance modulation circuit 130 may include a second inverter IV2, a fourth capacitor C4, and a fifth switch S5. The second inverter IV2 may receive the first setup voltage Vset1 as a voltage source, and may output an inverted clock signal of the second clock signal CLK2 to an eighth node N8. The first setup voltage Vset1 may be a positive voltage arbitrarily set to limit the maximum level of the first voltage Vcom1 output from the voltage output circuit 100.

The fourth capacitor C4 may be connected between the eighth node N8 and the ground terminal GND, and may make a voltage output from the second inverter IV2 into a sine waveform. The fifth switch S5 may be connected between the eighth node N8 and the seventh node N7, and may be implemented with an NMOS transistor that is turned on or turned off in response to the first selection signal SEL1. When the first selection signal SEL1 has the high level, the fifth switch S5 is turned on, so that the eighth node N8 and the seventh node N7 are electrically connected to each other. Therefore, the second resistance modulation circuit 130 may be activated when the first selection signal SEL1 has the high level and deactivated when the first selection signal SEL1 has the low level. When the second clock signal CLK2 is input while the fifth switch S5 is turned on, the second sub voltage Vsub2 having the sine waveform may be applied to the seventh node N7.

The second current modulation circuit 140 may be connected to the voltage output circuit 100 through the seventh node N7. The second current modulation circuit 140 may include a fifth capacitor C5, a second resistor R2, and a sixth switch S6. The fifth capacitor C5 may be connected between a terminal to which the first clock signal CLK1 is input and a ninth node N9, and may charge the first clock signal CLK1 to output the voltage having the sine waveform to the ninth node N9.

The second resistor R2 may be connected between a terminal to which the second setup voltage Vset2 is applied and the ninth node N9. The second setup voltage Vset2 may be a positive voltage arbitrarily set to maintain a minimum level of the voltage applied to the ninth node N9. For example, the second setup voltage Vset2 may be set to have a ½ level of the power voltage VDD. The second resistor R2 may be used to remove noise from the voltage of the ninth node N9. The sixth switch S6 may be connected between the ninth node N9 and the seventh node N7, and may be implemented with an NMOS transistor that is turned on or turned off in response to the second selection signal SEL2. The second selection signal SEL2 may be the inverted signal of the first selection signal SEL1. Therefore, when the second selection signal SEL2 has the high level, the second current modulation circuit 140 may be activated and the second resistance modulation circuit 130 may be deactivated. When the sixth switch S6 is turned on, the voltage having the sine waveform of the ninth node N9 may be transmitted to the seventh node N7, and the voltage transmitted to the seventh node N7 may become the second sub voltage Vsub2.

As described above, when the first sub voltage Vsub1 is applied to the fourth node N4 and the second sub voltage Vsub2 is applied to the seventh node N7, turn-on levels of the first and second switches S1 and S2 included in the voltage output circuit 100 may be changed according to the first and second sub voltages Vsub1 and Vsub2. Therefore, the first current path I1 may be formed through the first switch S1, and the second current path I2 may be formed through the second switch S2. When the first or second switch S1 or S2 is turned on, since a current flows through the second node N2 to the ground terminal GND, the first voltage Vcom1 may be generated at the second node N2.

A level of the first voltage Vcom1 may be adjusted according to a resistance value of the variable resistor VR. When the resistance value of the variable resistor VR increases, the level of the first voltage Vcom1 may decrease, and when the resistance value of the variable resistor VR decreases, the level of the first voltage Vcom1 may increase. For example, the variable resistor VR may be configured so that the resistance value thereof has the maximum value when all bits of the resistance variable code RES<N:0> has 1 data, and the resistance value thereof decreases as the number of 1 data included in the resistance variable code RES<N:0> decreases. In this case, the first voltage Vcom1 may have a minimum level when all bits of the resistance variable code RES<N:0> has 1 data. Whenever the number of 1 data included in the resistance variable code RES<N:0> decreases, the level of the first voltage Vcom1 may be increased step by step. Here, 1 data means a logic high code, and 0 data means a logic low code.

Figure 5:
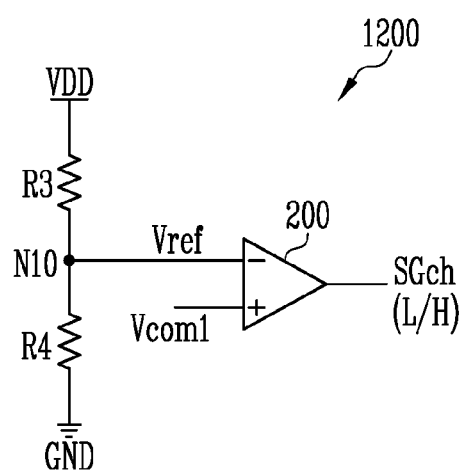
FIG. 5 illustrates a comparing circuit according to an embodiment of the present disclosure.

FIG. 5 illustrates the comparing circuit 1200 of FIG. 1 according to an embodiment of the present disclosure.

Referring to FIG. 5, the comparing circuit 1200 may be configured to compare the first voltage Vcom1 output from the detecting circuit 1100 with a reference voltage Vref and output the check signal SGch according to a comparison result. For example, the comparing circuit 1200 may include third and fourth resistors R3 and R4 and a comparator 200.

The third and fourth resistors R3 and R4 may be connected in series between a terminal to which the power voltage VDD is supplied and the ground terminal GND. The reference voltage Vref may be output through a tenth node N10 between the third and fourth resistors R3 and R4. Therefore, the reference voltage Vref may be generated by dividing the power voltage VDD using the third and fourth resistors R3 and R4.

The reference voltage Vref may be applied to a negative (−) terminal of the comparator 200, and the first voltage Vcom1 may be applied to a positive (+) terminal of the comparator 200. Therefore, when the first voltage Vcom1 is lower than the reference voltage Vref, the comparator 200 may output the check signal SGch having a low level L, and when the first voltage Vcom1 is higher than the reference voltage Vref, the comparator 200 may output the check signal SGch having a high level H.

Figure 6:
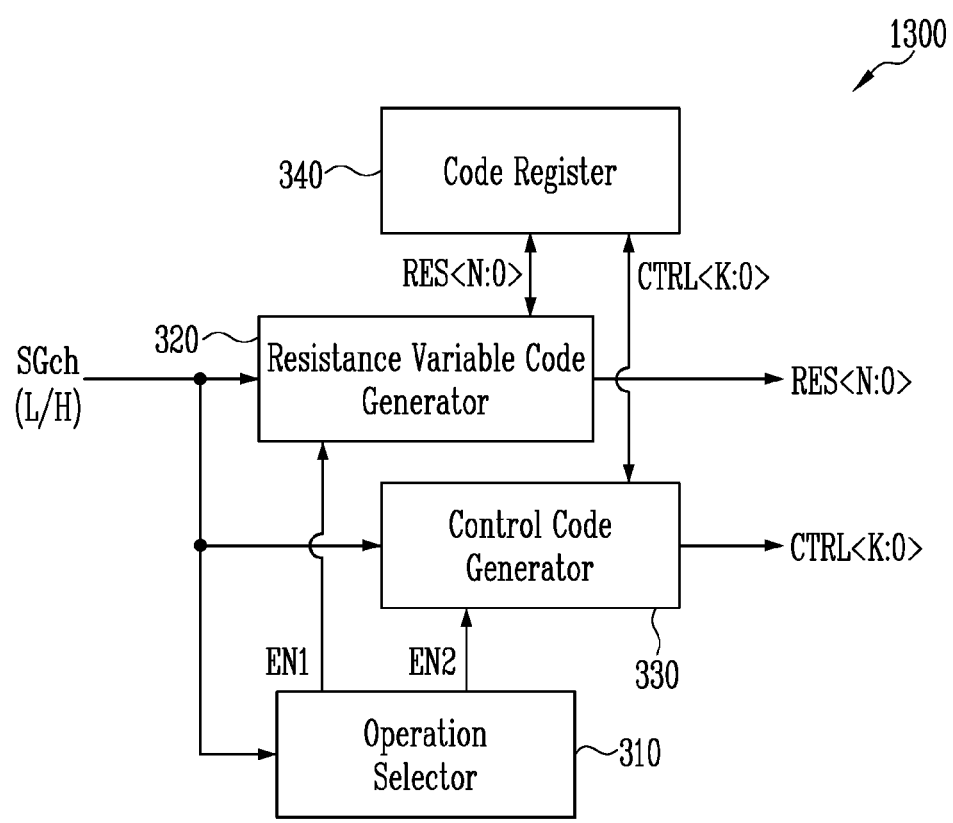
FIG. 6 illustrates a code generating circuit according to an embodiment of the present disclosure.

FIG. 6 illustrates the code generating circuit 1300 of FIG. 1 according to an embodiment of the present disclosure.

Referring to FIG. 6, the code generating circuit 1300 may include an operation selector 310, a resistance variable code generator 320, a control code generator 330 and a code register 340.

The operation selector 310 may be configured to select the first modulation operation and the second modulation operation in different time periods. In the first modulation operation, the resistance variable code RES<N:0> may be determined, and in the second modulation operation, the control code CTRL<K:0> may be determined. The operation selector 310 may output a first enable signal EN1 to perform the first modulation operation, and may output a second enable signal EN2 to perform the second modulation operation. Since the second modulation operation is performed after the first modulation operation is performed, the operation selector 310 sequentially outputs the first and second enable signals EN1 and EN2 without simultaneously outputting the first and second enable signals EN1 and EN2.

When the operation selector 310 activates the first enable signal EN1 and deactivates the second enable signal EN2, the resistance variable code generator 320 may be activated in response to the activated first enable signal EN1. When the activated first enable signal EN1 is input, the resistance variable code generator 320 may output an initialized resistance variable code RES<N:0>. All bits of the initialized resistance variable code RES<N:0> may have 1 data. Subsequently, when the check signal SGch is input to the resistance variable code generator 320, the resistance variable code generator 320 may decrease the number of 1 data included in the resistance variable code RES<N:0> or output a previous resistance variable code RES<N:0> to the code register 340 according to a level of the check signal SGch. For example, when the check signal SGch having the low level L is input to the resistance variable code generator 320, the resistance variable code generator 320 may decrease the number of 1 data included in the resistance variable code RES<N:0> by a predetermined number. At this time, the operation selector 310 may maintain a current state when the check signal SGch having the low level L is input. For example, the operation selector 310 may deactivate the second enable signal EN2 and output the activated first enable signal EN1.

For example, when the resistance variable code RES<N:0> includes 5 bits, the initialized resistance variable code RES<N:0> may be 11111. Subsequently, when the check signal SGch having the low level L is input, the resistance variable code generator 320 decreases the number of 1 data included in the resistance variable code RES<N:0>. For example, the resistance variable code generator 320 may change the resistance variable code RES<N:0> to 11110 and output the changed resistance variable code RES<N:0>. That is, the resistance variable code generator 320 may sequentially change 1 data included in the resistance variable code RES<N:0> to 0 data whenever the check signal SGch having the low level L is input. Therefore, when the check signal SGch having the low level L is input after the resistance variable code RES<N:0> of 11110 is output, the resistance variable code generator 320 may output the resistance variable code RES<N:0> of 11100. When the check signal SGch having the low level L is input after the resistance variable code RES<N:0> of 11100 is output, the resistance variable code generator 320 may output the resistance variable code RES<N:0> of 11000.

In the above-described method, when the check signal SGch having the high level H is input while the resistance variable code RES<N:0> is changed and output in response to the check signal SGch having the low level L, the resistance variable code generator 320 may output the previously output resistance variable code RES<N:0> without changing the resistance variable code RES<N:0>. At this time, the resistance variable code generator 320 may also transmit the resistance variable code RES<N:0> to the code register 340. The code register 340 may store the resistance variable code RES<N:0> transmitted from the resistance variable code generator 320.

When the check signal SGch having the high level H is input, the operation selector 310 may deactivate the first enable signal EN1 and activates the second enable signal EN2.

When the first enable signal EN1 is deactivated, the resistance variable code generator 320 may receive the resistance variable code RES<N:0> stored in the code register 340, and output the received resistance variable code RES<N:0>.

When the second enable signal EN2 is activated, the control code generator 330 may output an initialized control code CTRL<K:0> (K is a positive integer). All bits of the initialized control codes CTRL<K:0> may include 1 data. Subsequently, when the check signal SGch is input to the control code generator 330, the control code generator 330 may decrease the number of 1 data included in the control code CTRL<K:0> or output a previous control code CTRL<K:0> to the code register 340 according to the level of the check signal SGch. For example, when the check signal SGch having the low level L is input to the control code generator 330, the control code generator 330 may decrease the number of 1 data included in the control code CTRL<K:0>. At this time, the operation selector 310 may maintain a current state when the check signal SGch having the low level L is input. For example, the operation selector 310 may deactivate the first enable signal EN1 and output the activated second enable signal EN2.

For example, when the control code CTRL<K:0> includes 10 bits, the initialized control code CTRL<K:0> may be 1111111111. Subsequently, when the check signal SGch having the low level L is input, the control code generator 330 decreases the number of 1 data included in the control code CTRL<K:0>. For example, the control code generator 330 may change the control code CTRL<K:0> to 1111111110 and output the changed code CTRL<K:0>. That is, the control code generator 330 may change 1 data included in the control code CTRL<K:0> to 0 data whenever the check signal SGch having the low level L is input. Therefore, when the check signal SGch having the low level L is input after the control code CTRL<K:0> of 1111111110 is output, the control code generator 330 may output the control code CTRL<K:0> of 1111111100. When the check signal SGch having the low level L is input after the control code CTRL<K:0> of 1111111100 is output, the control code generator 330 may output the control code CTRL<K:0> of 1111111000.

When an operation of changing the control codes CTRL<K:0> in response to the check signal SGch having the low level L in the above-described method is repeated several times and then the check signal SGch having the high level H is input, the control code generator 330 may output a previously output control code CTRL<K:0> without changing the control code CTRL<K:0>. At this time, the control code generator 330 may transmit the control code CTRL<K:0> to the code register 340, and the code register 340 may store the control code CTRL<K:0> transmitted from the control code generator 330 when the check signal SGch having the high level H is input.

Figure 7:
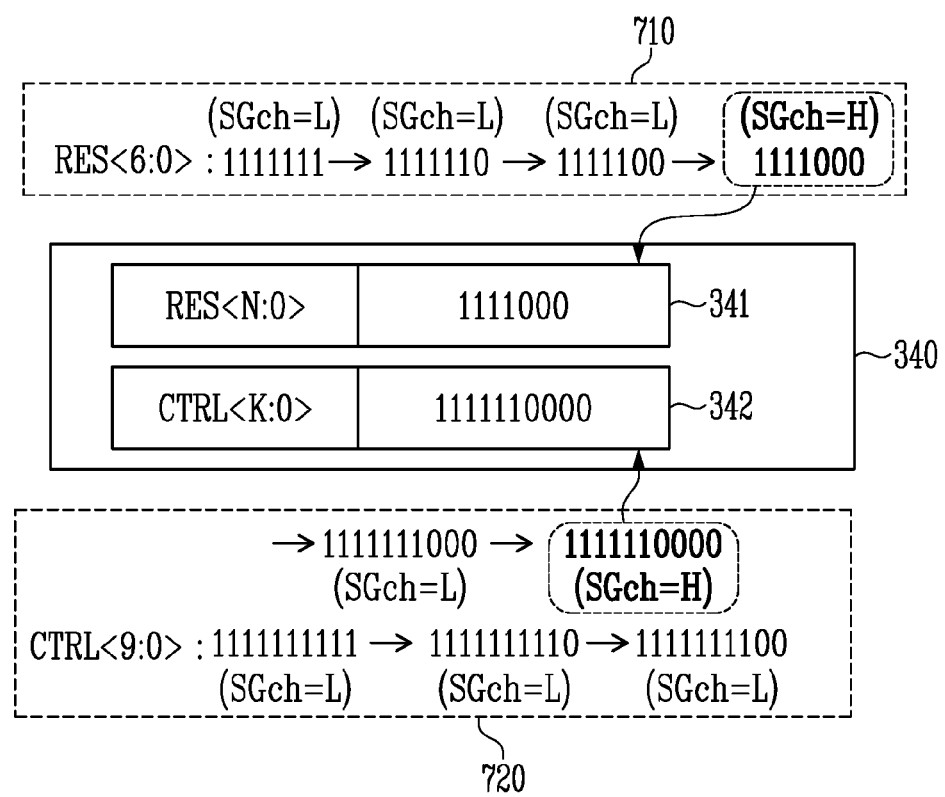
FIG. 7 illustrates a resistance variable code and a control code stored in a code register.

FIG. 7 illustrates a resistance variable code and a control code stored in the code register 340 of FIG. 6.

Referring to FIG. 7, the code register 340 may include a first buffer 341 and a second buffer 342 for storing the resistance variable code RES<N:0> and the control code CTRL<K:0>, respectively. That is, the resistance variable code RES<N:0> may be stored in the first buffer 341, and the control code CTRL<K:0> may be stored in the second buffer 342.

In a first modulation operation 710, the resistance variable code RES<N:0> may be determined, and in a second modulation operation 720, the control code CTRL<K:0> may be determined.

Assuming that the resistance variable code RES<N:0> includes 7 bits and the control code CTRL<K:0> includes 10 bits, an initialized resistance variable code RES<6:0> becomes 1111111. When the check signal SGch for the initialized resistance variable code RES<6:0> of 1111111 has the low level L, the resistance variable code RES<6:0> is converted to 1111110. When the check signal SGch for the resistance variable code RES<6:0> of 1111110 has the low level L, the resistance variable code RES<6:0> is converted to 1111100. When the check signal SGch for the resistance variable code RES<6:0> of 1111100 has the low level L, the resistance variable code RES<6:0> is converted to 1111000. When the check signal SGch for the resistance variable code RES<6:0> of 1111000 has the high level H, the resistance variable code RES<6:0> may be determined as 1111000, and the resistance variable code RES<6:0> of 1111000 may be stored in the first buffer 341.

When the resistance variable code RES<6:0> is determined, the first modulation operation 710 may be ended and the second modulation operation 720 for determining the control code CTRL<9:0> may be performed.

The initialized control code CTRL<9:0> becomes 1111111111. When the check signal SGch for the initialized control code CTRL<9:0> of 1111111111 has the low level L, the control code CTRL<9:0> is converted to 1111111110. When the check signal SGch for the control code CTRL<9:0> of 1111111110 has the low level L, the control code CTRL<9:0> is converted to 1111111100. When the check signal SGch for the control code CTRL<9:0> of 1111111100 has the low level L, the control code CTRL<9:0> is converted to 1111111000. When the check signal SGch for the control code CTRL<9:0> of 1111111000 has the low level L, the control code CTRL<9:0> is converted to 1111110000. When the check signal SGch for the control code CTRL<9:0> of 1111110000 has the high level H, the control code CTRL<9:0> may be determined as 1111110000, and the control code CTRL<9:0> of 1111110000 may be stored in the second buffer 342.

When the first and second modulation operations 710 and 720 are ended, the resistance variable code RES<N:0> and the control code CTRL<K:0> stored in the first and second buffers 341 and 342 may be used.

Figure 8:
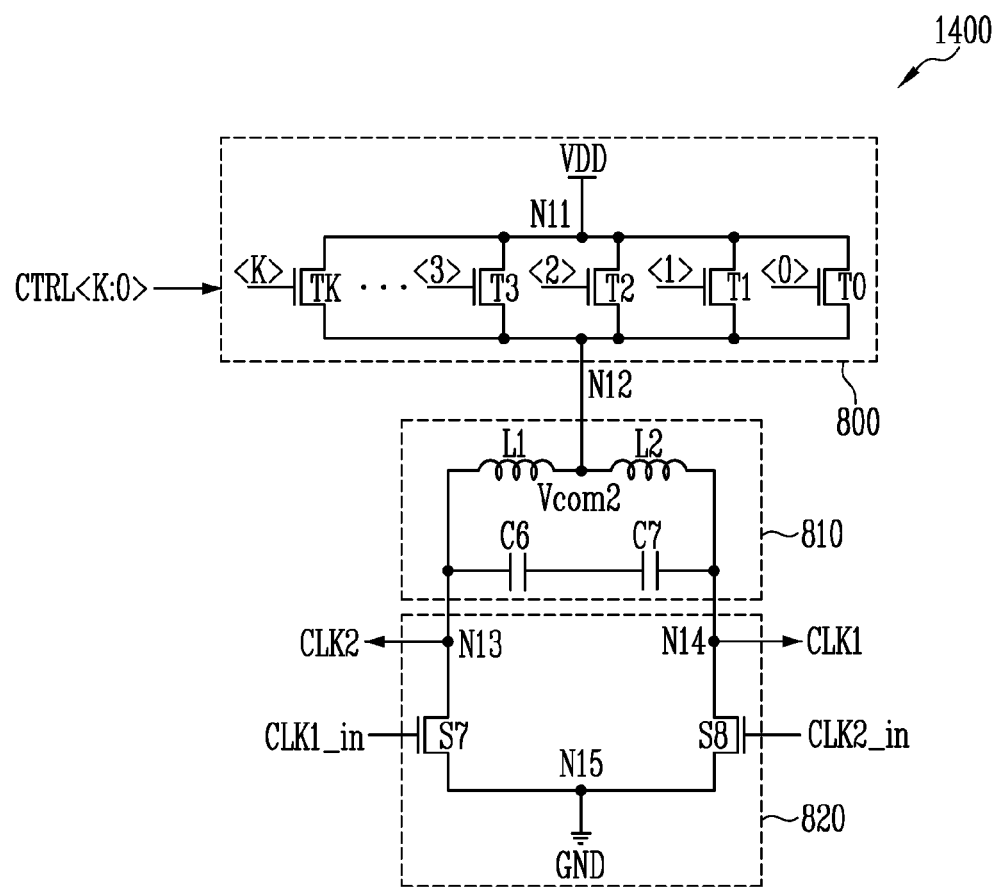
FIG. 8 illustrates an oscillator according to an embodiment of the present disclosure.

FIG. 8 illustrates the oscillator 1400 of FIG. 1 according to an embodiment of the present disclosure.

Referring to FIG. 8, the oscillator 1400 may include an amplitude adjusting circuit 800, an LC circuit 810, and a clock outputting circuit 820.

The amplitude adjusting circuit 800 may include a plurality of switches T0 to TK operating in response to the control code CTRL<K:0>. The plurality of switches T0 to TK may be connected in parallel between an eleventh node N11 and a twelfth node N12. The power voltage VDD may be supplied to the eleventh node N11, and the LC circuit 810 may be connected to the twelfth node N12. The plurality of switches T0 to TK may be implemented with NMOS transistors that are turned on or turned off according to respective bits of the control code CTRL<K:0>. For example, the T0 switch may be turned on or turned off according to the CTRL<0> of the control code CTRL<K:0>, the T1 switch may be turned on or turned off according to the CTRL<1> of the control code CTRL<K:0>, and the TK switch may be turned on or turned off according to the CTRL<K> of the control code CTRL<K:0>. Therefore, when all bits of the control code CTRL<K:0> include 1 data, all of the plurality of switches T0 to TK may be turned on, and the number of switches turned off among the plurality of switches T0 to TK may increase as the number of 1 data included in the control code CTRL<K:0> decreases. Therefore, when all of the plurality of switches T0 to TK are turned on, a second voltage Vcom2 of the twelfth node N12 may be generated at the lowest level. The second voltage Vcom2 of the twelfth node N12 may increase step by step as the number of switches turned off among the plurality of switches T0 to TK increases.

The LC circuit 810 may be configured to generate the second voltage Vcom2 that has a frequency depending on a current generated by the amplitude adjusting circuit 800. For example, the LC circuit 810 may include one or more inductors and one or more capacitors. In the LC circuit 810, L means an inductor and C means a capacitor.

For example, the LC circuit 810 may include two inductors, e.g., first and second inductors L1 and L2, and two capacitors, e.g., sixth and seventh capacitors C6 and C7. The twelfth node N12 may be connected to and disposed between the first and second inductors L1 and L2. The first and second inductors L1 and L2 are connected in series between a thirteenth node N13 and a fourteenth node N14. The sixth and seventh capacitors C6 and C7 are connected in series between the thirteenth node N13 and the fourteenth node N14. The first inductor L1 and the sixth capacitor C6 may be connected to the thirteenth node N13, and the second inductor L2 and the seventh capacitor C7 may be connected to the fourteenth node N14. The second voltage Vcom2 may be generated at the twelfth node N12 according to a current flowing through the twelfth node N12.

The clock outputting circuit 820 may include seventh and eighth switches S7 and S8. The seventh switch S7 may be connected between the thirteenth node N13 and a fifteenth node N15, and may be implemented with an NMOS transistor that is turned on or turned off in response to the first clock input signal CLK1_in. The eighth switch S8 may be connected between the fourteenth node N14 and the fifteenth node N15, and may be implemented with an NMOS transistor that is turned on or turned off in response to the second clock input signal CLK2_in. The fifteenth node N15 may be connected to the ground terminal GND.

For example, the first clock input signal CLK1_in may be formed of a waveform having the same phase as the first clock signal CLK1, and the second clock input signal CLK2_in may be formed of a waveform having the same phase as the second clock signal CLK2. When the first clock input signal CLK1_in has a high level H and the second clock input signal CLK2_in has a low level L, the second clock signal CLK2 having the low level L may be output through the thirteenth node N13, and the first clock signal CLK1 having the high level H may be output through the fourteenth node N14. On the other hand, when the second clock input signal CLK2_in has the high level H and the first clock input signal CLK1_in has the low level L, the second clock signal CLK2 having the high level H may be output through the thirteenth node N13, and the first clock signal CLK1 having the low level L may be output through the fourteenth node N14.

The amplitude of the first and second clock signals CLK1 and CLK2 output through the thirteenth and fourteenth nodes N13 and N14, respectively, may be determined by a level of the second voltage Vcom2, and the level of the second voltage Vcom2 may be adjusted according to the control code CTRL<K:0> input to the amplitude adjusting circuit 800. In particular, the first and second clock signals CLK1 and CLK2 output from the oscillator 1400 may be fed back to the modulation circuit 2000 of FIG. 1. The modulation circuit 2000 may adjust a level of a voltage generated according to the first and second clock signals CLK1 and CLK2 and may adjust the control code CTRL<K:0> according to the adjusted voltage. Therefore, the oscillator 1400 may output the first and second clock signals CLK1 and CLK2 having the amplitude adjusted according to the control code CTRL<K:0>. For example, since the amplitude of the first and second clock signals CLK1 and CLK2 may be adjusted within a range not exceeding a breakdown voltage of the seventh and eighth switches S7 and S8 in the clock outputting circuit 820, performance and reliability of the oscillator 1400 may be improved.

FIG. 9 illustrates an amplitude modulation operation according to an embodiment of the present disclosure. The amplitude modulation operation shown in FIG. 9 may be performed by the clock signal generating circuit 1000 of FIG. 1.

Referring to FIG. 9, the amplitude modulation operation may include a first modulation operation S910 and a second modulation operation S920.

The first modulation operation S910 is specifically described as follows.

When the first modulation operation S910 is started, the resistance variable code RES<N:0> may be initialized at S91. All bits of the initialized resistance variable code RES<N:0> may include 1 data.

Subsequently, the first and second clock signals CLK1 and CLK2 may be generated using the resistance variable code RES<N:0>, and an operation of determining whether the check signal SGch generated according to the first and second clock signals CLK1 and CLK2 has a high level H or not may be performed at S92. When the check signal SGch has a low level L, i.e., when it is determined at S92 that the check signal SGch does not have the high level H, the resistance variable code RES<N:0> is changed at S93. For example, the number of 1 data included in the resistance variable code RES<N:0> may decrease and the number of 0 data included in the resistance variable code RES<N:0> may increase. The first and second clock signals CLK1 and CLK2 may be generated again using the resistance variable code RES<N:0> changed at S93, and the first modulation operation S910 may return to S92. The steps S92 and S93 may be repeated until the check signal SGch has the high level H.

When it is determined at S92 that the check signal SGch has the high level H, the last generated resistance variable code RES<N:0> may be stored at S94. When the resistance variable code RES<N:0> is stored, the first modulation operation S910 may be ended and the second modulation operation S920 may be performed.

When the second modulation operation S920 is started, the control code CTRL<K:0> may be initialized at S95. All bits of the initialized control code CTRL<K:0> may include 1 data.

Subsequently, the first and second clock signals CLK1 and CLK2 are generated using the control code CTRL<K:0>, and an operation of determining whether the check signal SGch generated according to the first and second clock signals CLK1 and CLK2 has the high level H or not may be performed at S96. When it is determined at S96 that the check signal SGch has the low level L, the control code CTRL<K:0> may be changed at S97. For example, the number of 1 data included in the control code CTRL<K:0> may decrease and the number of 0 data included in the control code CTRL<K:0> may increase. The first and second clock signals CLK1 and CLK2 may be generated again using the control code CTRL<K:0> changed at S97, and the second modulation operation S920 may return to S96. The steps S96 and S97 may be repeated until the check signal SGch has the high level H.

When it is determined at S96 that the check signal SGch has the high level H, the last generated control code CTRL<K:0> may be stored at S98. When the control code CTRL<K:0> is stored, the second modulation operation S920 may be ended.

After the second modulation operation S920 is ended, the first and second clock signals CLK1 and CLK2 may be generated using the resistance variable code RES<N:0> stored at S94 and the control code CTRL<K:0> stored at S98.

The embodiments of the present disclosure disclosed in the present specification and drawings are merely provided with specific examples to easily describe the technical content of the present disclosure and to help understanding of the present disclosure, and are not intended to limit the scope of the present disclosure. It is obvious to those of ordinary skill in the art that other modified examples based on the technical spirit of the present disclosure may be implemented in addition to the embodiments disclosed herein.

What is claimed is:

1. A clock signal generating circuit, comprising:
   a detecting circuit configured to generate a first voltage based on first and second clock signals and adjust a level of the first voltage in response to first and second setup voltages and a resistance variable code;
   a comparing circuit configured to compare the first voltage and a reference voltage and output a check signal according to a comparison result;
   a code generating circuit configured to perform a first modulation operation for determining the resistance variable code in response to the check signal and perform a second modulation operation for determining a control code in response to the check signal; and
   an oscillator configured to adjust an amplitude of the first and second clock signals in response to the control code, and output the first and second clock signals having the adjusted amplitude.

2. The clock signal generating circuit of claim 1, wherein the detecting circuit comprises:
   a voltage output circuit configured to receive a power voltage and generate the first voltage by adjusting a resistance value of the voltage output circuit in response to the resistance variable code;
   a first resistance modulation circuit and a second resistance modulation circuit configured to selectively form a current path in the voltage output circuit in response to the first and second clock signals, respectively, during the first modulation operation; and
   a first current modulation circuit and a second current modulation circuit configured to selectively form a current path in the voltage output circuit in response to the first and second clock signals, respectively, during the second modulation operation.

3. The clock signal generating circuit of claim 2, wherein the first setup voltage is a positive voltage set to limit a maximum level of the first voltage output from the voltage output circuit, and the second setup voltage is a positive voltage set to maintain a minimum level of a first sub voltage output from the first resistance modulation circuit or the first current modulation circuit to the voltage output circuit and a minimum level of a second sub voltage output from the second resistance modulation circuit or the second current modulation circuit to the voltage output circuit.

4. The clock signal generating circuit of claim 2, wherein the first resistance modulation circuit and the second resistance modulation circuit are activated during the first modulation operation, and
   the first current modulation circuit and the second current modulation circuit are activated during the second modulation operation.

5. The clock signal generating circuit of claim 2, wherein the voltage output circuit comprises:
   a first capacitor and a variable resistor connected in parallel between a first node and a second node, the power voltage being supplied to the first node; and
   first and second switches connected in parallel between the second node and a ground terminal.

6. The clock signal generating circuit of claim 5, wherein the first voltage is generated at the second node.

7. The clock signal generating circuit of claim 5, wherein the variable resistor is configured to adjust the resistance value of the voltage output circuit in response to the resistance variable code.

8. The clock signal generating circuit of claim 5, wherein the first switch is turned on or turned off according to a first sub voltage at a first output node of the first resistance modulation circuit or the first current modulation circuit, and
   the second switch is turned on or turned off according to a second sub voltage at a second output node of the second resistance modulation circuit or the second current modulation circuit.

9. The clock signal generating circuit of claim 2, wherein the first resistance modulation circuit is configured to receive the first setup voltage and output a first sub voltage to the voltage output circuit in response to the first clock signal.

10. The clock signal generating circuit of claim 9, wherein the first resistance modulation circuit comprises:
    a first inverter configured to output an inverted clock signal of the first clock signal using the first setup voltage as a voltage source;
    a second capacitor making the inverted clock signal of the first clock signal into a sine waveform; and
    a third switch configured to output a voltage having the sine waveform as the first sub voltage, in response to a first selection signal.

11. The clock signal generating circuit of claim 2, wherein the second resistance modulation circuit is configured to receive the first setup voltage and output a second sub voltage to the voltage output circuit in response to the second clock signal.

12. The clock signal generating circuit of claim 11, wherein the second resistance modulation circuit comprises:
    a second inverter configured to output an inverted clock signal of the second clock signal using the first setup voltage as a voltage source;
    a fourth capacitor making the inverted clock signal of the second clock signal into a sine waveform; and
    a fifth switch configured to output a voltage having the sine waveform as the second sub voltage, in response to a first selection signal.

13. The clock signal generating circuit of claim 2, wherein the first current modulation circuit is configured to receive the second setup voltage and output a first sub voltage to the voltage output circuit in response to the second clock signal.

14. The clock signal generating circuit of claim 13, wherein the first current modulation circuit comprises:
a third capacitor receiving the second clock signal through one end and making the second clock signal into a sine waveform;
a first resistor connected between a terminal to which the second setup voltage is supplied and the other end of the third capacitor; and
a fourth switch configured to output a voltage having the sine waveform as the first sub voltage, in response to a second selection signal.

15. The clock signal generating circuit of claim 2, wherein the second current modulation circuit is configured to receive the second setup voltage and output a second sub voltage to the voltage output circuit in response to the first clock signal.

16. The clock signal generating circuit of claim 15, wherein the second current modulation circuit comprises:
a fifth capacitor receiving the first clock signal through one end and making the first clock signal into a sine waveform;
a second resistor connected between a terminal to which the second setup voltage is supplied and the other end of the fifth capacitor; and
a sixth switch configured to output a voltage having the sine waveform as the second sub voltage, in response to a second selection signal.

17. The clock signal generating circuit of claim 1, wherein the comparing circuit comprises:
third and fourth resistors connected in series between a terminal to which a power voltage is supplied and a ground terminal, and configured to divide the power voltage to generate the reference voltage; and
a comparator configured to compare the reference voltage and the first voltage to output the check signal.

18. The clock signal generating circuit of claim 1, wherein the code generating circuit comprises:
an operation selector configured to output a first enable signal activated during the first modulation operation and output a second enable signal activated during the second modulation operation;
a resistance variable code generator configured to be activated in response to the first enable signal and adjust the resistance variable code in response to the check signal;
a control code generator configured to be activated in response to the second enable signal and adjust the control code in response to the check signal; and
a code register configured to store the resistance variable code determined by the resistance variable code generator and the control code determined by the control code generator.

19. The clock signal generating circuit of claim 18, wherein the resistance variable code generator is configured to decrease a number of first data included in the resistance variable code whenever the check signal has a first level and transmit, to the code register, the resistance variable code that is determined when the check signal is changed from the first level to a second level.

20. The clock signal generating circuit of claim 18, wherein the control code generator is configured to decrease a number of first data included in the control code whenever the check signal has a first level and transmit, to the code register, the control code that is determined when the check signal is changed from the first level to a second level.

21. The clock signal generating circuit of claim 1, wherein the oscillator comprises:
an amplitude adjusting circuit configured to generate a current for adjusting the amplitude of the first and second clock signals in response to the control code;
an LC circuit configured to generate a second voltage having a frequency determined according to the current; and
a clock outputting circuit configured to output the first and second clock signals in response to first and second clock input signals having different phases.

22. The clock signal generating circuit of claim 21, wherein the amplitude adjusting circuit includes a plurality of switches connected in parallel between a terminal to which a power voltage is supplied and the LC circuit, and the plurality of switches operate in response to the control code.

23. The clock signal generating circuit of claim 21, wherein the LC circuit includes first and second inductors and sixth and seventh capacitors that are disposed between the amplitude adjusting circuit and the clock outputting circuit.

24. The clock signal generating circuit of claim 23, wherein the first and second inductors are connected in series with each other, the sixth and seventh capacitors are connected in series with each other, and the first and second inductors and the sixth and seventh capacitors are connected in parallel with each other.

25. The clock signal generating circuit of claim 21, wherein the clock outputting circuit comprises:
a seventh switch configured to generate the second clock signal in response to the first clock input signal; and
an eighth switch configured to generate the first clock signal in response to the second clock input signal.

26. A clock signal generating circuit, comprising:
an oscillator configured to output first and second clock signals; and
a modulation circuit configured to receive first and second setup voltages and the first and second clock signals, and generate a control code adjusted according to the first and second setup voltages and the first and second clock signals,
wherein the oscillator is configured to adjust an amplitude of the first and second clock signals according to the control code.

27. The clock signal generating circuit of claim 26, wherein the modulation circuit comprises:
a detecting circuit configured to generate a first voltage based on the first and second clock signals and adjust a level of the first voltage in response to the first and second setup voltages and a resistance variable code;
a comparing circuit configured to compare the first voltage and a reference voltage and output a check signal according to a comparison result; and
a code generating circuit configured to perform a first modulation operation for determining the resistance variable code in response to the check signal and perform a second modulation operation for determining the control code in response to the check signal.

* * * * *